(12) United States Patent
Herring

(10) Patent No.: US 11,423,196 B2
(45) Date of Patent: Aug. 23, 2022

(54) SYSTEMS AND METHODS FOR PREDICTING RESPONSES OF A PARTICLE TO A STIMULUS

(71) Applicant: Toyota Research Institute, Inc., Los Altos, CA (US)

(72) Inventor: Patrick K. Herring, Mountain View, CA (US)

(73) Assignee: Toyota Research Institute, Inc., Los Altos, CA (US)

( * ) Notice: Subject to any disclaimer, the term of this patent is extended or adjusted under 35 U.S.C. 154(b) by 896 days.

(21) Appl. No.: 16/202,719

(22) Filed: Nov. 28, 2018

(65) Prior Publication Data
US 2020/0167438 A1    May 28, 2020

(51) Int. Cl.
*G06F 30/20* (2020.01)
*G06T 7/10* (2017.01)
*G06N 20/00* (2019.01)

(52) U.S. Cl.
CPC ............ *G06F 30/20* (2020.01); *G06N 20/00* (2019.01); *G06T 7/10* (2017.01); *G06T 2207/20081* (2013.01)

(58) Field of Classification Search
None
See application file for complete search history.

(56) References Cited

U.S. PATENT DOCUMENTS

| | | | |
|---|---|---|---|
| 2007/0240242 A1 | 10/2007 | Modiano et al. | |
| 2014/0334689 A1* | 11/2014 | Butler | G06T 7/254 382/108 |
| 2016/0123938 A1* | 5/2016 | Ly | G01N 33/0004 702/26 |
| 2016/0135925 A1* | 5/2016 | Mason | G16H 50/50 703/2 |
| 2017/0011506 A1* | 1/2017 | Bojovschi | G01N 15/1404 |
| 2017/0235852 A1 | 8/2017 | Joshi et al. | |
| 2017/0241891 A1 | 8/2017 | Grier et al. | |
| 2018/0370037 A1* | 12/2018 | Han | B25J 9/1664 |
| 2019/0163267 A1* | 5/2019 | Hainzl | G06F 3/013 |
| 2020/0082548 A1* | 3/2020 | Graham | G01C 21/165 |

(Continued)

OTHER PUBLICATIONS

Fernandes et al., "Segmentation of TEM Images Using Oscillatory Neural Networks," Proceedings XIV Brazilian Symposium on Computer Graphics and Image Processing (Oct. 2001).

(Continued)

*Primary Examiner* — Toan H Vu
(74) *Attorney, Agent, or Firm* — Christopher G. Darrow; Darrow Mustafa PC

(57) ABSTRACT

System, methods, and other embodiments described herein relate to predicting effects of a stimulus on a particle or other material structure. In one embodiment, a method includes receiving a segmented image of a particle that identifies at least semantics of the particle and associated characteristics according to subregions of the particle. The method includes analyzing, using a stimulus model, the segmented image to predict changes in the particle associated with applying the stimulus to the particle. Analyzing the segmented image includes generating a predicted image identifying characteristics, semantics and other properties of the particle according to the changes. The method includes providing the predicted image as an electronic output.

20 Claims, 10 Drawing Sheets

(56) References Cited

U.S. PATENT DOCUMENTS

2020/0106996 A1* 4/2020 Singh .................... G06V 10/25
2020/0167546 A1* 5/2020 Herring ................ G06N 3/0454

OTHER PUBLICATIONS

Wang, "Effects of External Stimuli on Microstructure-Property Relationship at The Nanonscale," The Pennsylvania State University, ProQuest Dissertations Publishing (Aug. 2017).
Dahmen, et al., "Feature Adaptive Sampling for Scanning Electron Microscopy", Scientific Reports vol. 6, Article No. 25350 (May 2016).
Chen et al., "Semantic Image Segmentation with DeepLab in TensorFlow," Google AI blog (Mar. 12, 2018).

* cited by examiner

US 11,423,196 B2

SYSTEMS AND METHODS FOR PREDICTING RESPONSES OF A PARTICLE TO A STIMULUS

TECHNICAL FIELD

The subject matter described herein relates, in general, to systems and methods for predicting changes to particles subjected to a stimulus, and, in particular, to predicting the changes using by analyzing an image of the particle according to a stimulus model.

BACKGROUND

Developing new materials and further understanding existing materials for improving batteries, and other products can be expensive and time consuming. This is especially true in relation to products that include complex materials. In general, to improve upon existing materials, developers employ a variety of metrology and simulation techniques to predict how a material will behave under different conditions and how the material may be modified to improve performance. However, present approaches to studying and understanding materials with respect to microscale characteristics (e.g., molecule level responses to stresses, etc.) are inadequate. For example, finite element analysis (FEA) is a numerical method often used in combination with complex mathematical modeling to analyze structures and compositions of materials (i.e., particles/molecules). This approach provides inferences about properties of the material and other characteristics but is generally slow and computationally intensive leading to prolonged periods of research/analysis to resolve information about a single material under a single circumstance (e.g., particular stress). These difficulties can be especially pronounced when considering the need to analyze many different compounds under different stimuli in order to identify desirable research and development directions.

SUMMARY

In one embodiment, example systems and methods relate to a manner of predicting changes in a particle according to a stimulus. As mentioned previously, finite element analysis (FEA) and associated mathematical modeling techniques represent significant difficulties with respect to complexity and computational time especially when analyzing many different particles. The disclosed approach improves over prior difficulties by leveraging machine learning algorithms to automate the process of understanding the complexities of the particle and provides identification and prediction of material properties resulting in development of large scale data sets that were not previously available.

For example, in one embodiment, a disclosed system analyzes particles using microscopy images (e.g., transmission electron microscopy (TEM)). In one aspect, the microscopy images provide details of the structure and characteristics of the particle at, for example, a nanoscale. Thus, the images include fine details of the structure and are generally comprised of separate pixels that each include a diffraction pattern from scattered electrons of a corresponding location on the particle. While the image includes a dense representation of the particle, the representation in the image, and, in particular, the diffraction patterns function to encode the noted information in such a way that the information is not explicitly evident; especially to a manual review of the image.

As such, the disclosed system leverages the machine learning algorithm to analyze the image. The machine learning algorithm, in one approach, analyzes each pixel to produce a segmented image that indicates characteristics of different subregions within the particle and associated semantics. The semantics are physical traits, otherwise referred to as physics of the particle, such as characteristics of interfaces between different subregions. The various types of abutting subregions influence the semantics and thus how the particle responds to various stimuli (i.e., stresses) along the boundary. Moreover, when subjected to a stimulus (e.g., heat, mechanical stress, etc.) a particle can undergo changes such as physical deformations, chemical alterations, and so on.

While a basic awareness of semantics of the particle can be useful in understanding general structure and composition, predicting changes in the particle from exposure to various stimuli especially over extended periods of time is not necessarily possible with manual review of the semantics/characteristics. Thus, the disclosed system implements a stimulus model that is, for example, a generative model for predicting changes in the particle brought on by exposure to the stimulus. Accordingly, the disclosed system effectively simulates exposing the particle to the stimulus. In one aspect, the stimulus model accepts the segmented image identifying characteristics/semantics of the particle and produces a predicted image that indicates changes to characteristics/semantics of the particle as would likely occur if the particle was exposed to the stimulus.

In this way, the disclosed system provides a mechanism for determining properties of particles in order to predict how the particles may behave and thus provide guidance for improving the engineering of materials that comprise the particles. Moreover, the system achieves the noted results through simple computational analysis of images of the particles without the need to undertake complex experiments on each separate particle or manually develop models.

In one embodiment, a semantics system for predicting effects of a stimulus on a particle is disclosed. The semantics system includes one or more processors and a memory communicably coupled to the one or more processors. The memory stores a segmentation module including instructions that when executed by the one or more processors cause the one or more processors to receive a segmented image of the particle that identifies at least semantics of the particle and associated characteristics according to subregions of the particle. The memory stores a prediction module including instructions that when executed by the one or more processors cause the one or more processors to analyze, using a stimulus model, the segmented image to predict changes in the particle associated with applying the stimulus to the particle. The prediction module includes instructions to generate a predicted image of the particle according to the changes and to provide the predicted image as an electronic output.

In one embodiment, a non-transitory computer-readable medium for predicting effects of a stimulus on a particle and including instructions that when executed by one or more processors cause the one or more processors to perform one or more functions. The instructions include instructions to receive a segmented image of the particle that identifies at least semantics of the particle and associated characteristics according to subregions of the particle. The instructions include instructions to analyze, using a stimulus model, the segmented image to predict changes in the particle associated with applying the stimulus to the particle. The instructions to predict the changes include instructions to generate a predicted image of the particle according to the changes. The instructions include instructions to provide the predicted image as an electronic output.

In one embodiment, a method for predicting effects of a stimulus on a particle disclosed. In one embodiment, a method includes receiving a segmented image of a particle that identifies at least semantics of the particle and associated characteristics according to subregions of the particle. The method includes analyzing, using a stimulus model, the segmented image to predict changes in the particle associated with applying the stimulus to the particle. Analyzing the segmented image includes generating a predicted image of the particle according to the changes. The method includes providing the predicted image as an electronic output.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

Figure 1:
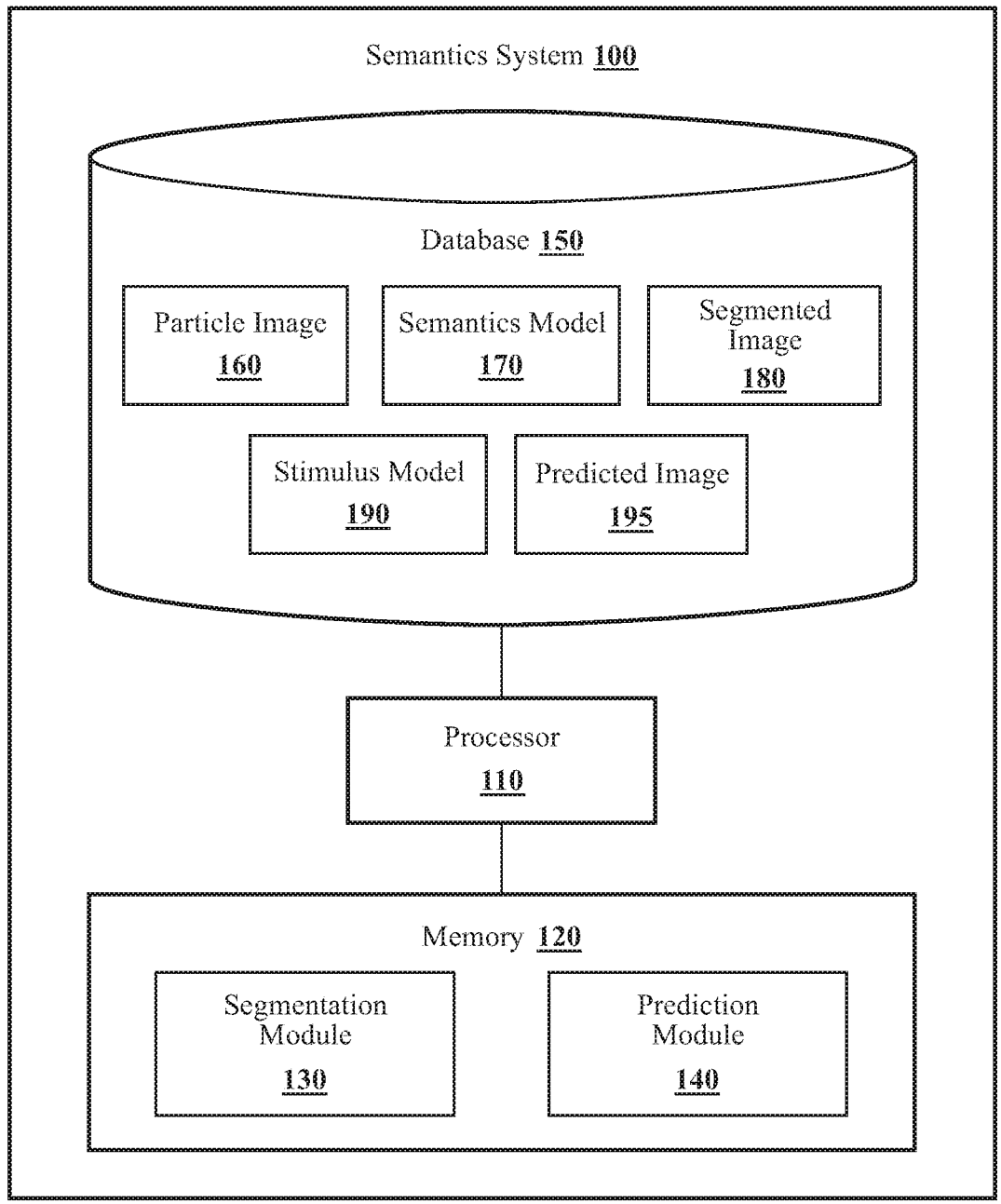
FIG. 1 illustrates one embodiment of a semantics system that is associated with identifying semantics of a particle by analyzing associated images.

Systems, methods, and other embodiments associated with predicting changes to a particle induced by a stimulus are disclosed. As mentioned previously, difficulties with respect to complexity and excessive computational time limit analysis and simulation of many different materials and particles, preventing determination of particle-level (i.e., mesoscale) behaviors and changes according to various stimuli. For example, when engineering a new material for a battery or other device, it may be useful to analyze a wide array of materials (compositions and structures) and determine the properties of the materials under a variety of conditions, such as exposure to various chemical environments, responses to electrical current, mechanical properties, and so on. Thus, if a given analysis is to include one hundred different particles and observations of the particles under ten different conditions, then the analysis would potentially be carried out over one thousand times. When using an approach such as FEA, analyzing one thousand different tests of particles represents an excessive effort, which is generally unsuitable for purposes of developing a new material. Accordingly, using FEA and mathematical modeling may cause analysis to be constrained within a smaller sample set, leading to a less robust development process. Additionally, FEA and other a-priori modeling techniques usually require a large amount of validation based on experimentally derived results, which significantly increases the amount of time and effort involved.

However, the disclosed approach improves analysis of the particles by providing an efficient mechanism to characterize the particles and generate predictions therefrom about how the particles are likely to respond to stimuli. More particularly, the disclosed approach improves over prior approaches by leveraging machine learning algorithms to develop understandings of the complexities and automate identification/prediction through the use of the understandings. For example, since the physics of the material are not explicitly programmed, but rather the machine learning algorithm infers the physics from the experimentally derived data, the disclosed system improves (e.g., drastically reduces) the amount of time and effort involved in analyzing the material.

In one embodiment, a disclosed system uses microscopy images (e.g., transmission electron microscopy (TEM)) to analyze particles depicted therein. In one aspect, the microscopy images provide fine details of the structure and characteristics of the particle. Thus, the images include high-order features and are generally comprised of separate pixels that each correspond with, for example, a diffraction pattern from scattered electrons of a corresponding location on the particle. The diffraction patterns function to encode the information about the particle in a dense representation (i.e., fine detail about each corresponding location on the particle) in such a way that the information is not explicitly evident especially to a manual review of the image.

As such, in one aspect, the disclosed system leverages one or more machine learning algorithm(s) to analyze the image. The machine learning algorithms, in one approach, include a semantics model that analyzes the diffraction pattern of each pixel along with the image overall to produce a segmented image identifying subregions in the image associated with locations on the particle having similar characteristics. In providing the segmented image, the disclosed system further identifies, for example, spatial relationships between pixels of various characteristics, and, in particular, identifies boundaries between the subregions having different characteristics. The boundaries generally correspond with different properties of the particle in relation to, for example, how the particle may respond to different stimuli. Accordingly, the disclosed system can classify the properties or semantics of the particle at the boundaries and across the subregions using the semantics model.

The semantics are physical traits such as attributes of interfaces between different regions of the particle that respond differently according to different characteristics of the abutting subregions. The various types of abutting subregions can cause different responses in the particle according to different stresses. Thus, the disclosed system identifies the semantics of the particle in order to provide awareness about how the particle may behave under different conditions. The disclosed system implements a stimulus model that leverages the information about the characteristics and semantics to predict changes/effects realized in the particle according to a stimulus. That is, the disclosed system simulates the effects of a stimulus on the particle and generates a predicted image of the particle resulting from the stimulus effecting characteristics of the particle. Accordingly, the disclosed system provides a computational approach to determining likely outcomes of exposure to a stimulus without actually subjecting the particle to the stimulus. In this way, the disclosed system improves overall understanding of the particle and characteristics/semantics of the particle such that selection of particles with desirable features and/or modification of the particles to avoid undesirable features is better facilitated.

Referring to FIG. 1, one embodiment of a semantics system 100 that is implemented to perform methods and other functions as disclosed herein relating to identifying characteristics of particles from images and predicting response to stimuli are illustrated. As an initial matter, it should be appreciated, that while the semantics system 100 is illustrated as being a single discrete system, in various embodiments, the semantics system 100 is a distributed system that is comprised of components that can be distributed across multiple computing devices such as servers, provided by a cloud-based service, and so on.

With further reference to FIG. 1, the semantics system 100 is shown as including a processor 110. Accordingly, the processor 110 may represent a distributed processing resource, an individual local processor (e.g., a CPU, GPU, or application specific processor), or the semantics system 100 may access the processor 110 through a data bus or another communication path. In one embodiment, the semantics system 100 includes a memory 120 that stores a segmentation module 130 and a prediction module 140. The memory 120 is a random-access memory (RAM), read-only memory (ROM), a hard-disk drive, a flash memory, a processor cache, or other suitable memory for storing the modules 130 and 140. The modules 130 and 140 are, for example, computer-readable instructions that when executed by the processor 110 cause the processor 110 to perform the various functions disclosed herein. Thus, as may be appreciated, in various implementations, the module 130 and 140 as envisioned herein may be integrated as a component of the processor 110, stored in an associated/accessible memory to the processor 110, implemented as a standalone electronic functional unit, and so on.

Moreover, as previously noted, in various embodiments, one or more aspects of the semantics system 100 are implemented as cloud-based services, and so on. Thus, one or more components of the semantics system 100 may be located remotely from other components and may be implemented in a distributed manner. As an additional matter, the semantics system 100 includes the database 150 as a means of storing various data elements. The database 150 is, in one embodiment, an electronic data structure stored in the memory 120 or a separate electronic data store and that is configured with, for example, routines that can be executed by the processor 110 for analyzing stored data, providing stored data, organizing stored data, and so on. Thus, in one embodiment, the database 150 stores data used by the modules 130 and 140 in executing various functions. In the embodiment, as depicted in FIG. 1, the database 150 includes a particle image 160, a semantics model 170, a segmented image 180, a stimulus model 190, a predicted image 195 and/or other information such as training data, and so on. Furthermore, while a single particle image 160, segmented image 180, and predicted image 195 are shown, the semantics system 100 can store a plurality of images to, for example, facilitate batch processing, analysis of multiple sets of particles or stimuli, and so on.

As additional explanation of the noted images prior to discussing the functionality of the semantics system 100, consider that the particle image 160 is, in one embodiment, a transmission electron microscopy (TEM) image of a particle. That is, a TEM microscope produces the particle image 160 from a sample of a particular material (e.g., lithium-based material). It should be appreciated that while a TEM microscope is discussed herein, in further approaches, the particular type of TEM microscope (e.g., conventional, scanning, etc.) may vary or other types of microscopes (e.g., x-ray) that produce similar diffraction patterns may be substituted. Moreover, the particle image 160 can be acquired through direct control of a generating device, through the acquisition of images previously generated and stored in a repository, and so on.

In either case, continuing with the process of generating the particle image 160, the sample is, in one embodiment, a homogenous sampling of a material that includes a plurality of occurrences of the particle. Thus, the particle image 160 generally represents a focused view of the sample that embodies the single particle. Moreover, as used herein, the particle is, for example, a basic unit (i.e., molecule) of the associated material and, thus, is representative of the material overall.

In one approach, the semantics system 100 controls the TEM microscope to scan the sample using a beam of electrons. Thus, the semantics system 100 can be integrated with the TEM microscope as a single electronic system or communicate with the TEM microscope over a direct link or network connection. In either case, the semantics system 100 provides electronic control signals/commands to the TEM microscope to cause the TEM microscope to produce the particle image 160 in a desired manner (e.g., with a particular coordinate overlay, etc.).

The TEM microscope directs the beam at the sample and detects electrons scattered from the beam by the sample to produce the particle image 160. Thus, in one approach, the TEM generates the particle image 160 according to detections of electron scatter patterns (i.e., diffraction patterns) at different locations on the particle. That is, the semantics system 100 may control the TEM microscope to scan/sweep or otherwise move a focus of the beam across the particle. In one approach, the TEM microscope scans the particle to generate the image 160 using a two-dimensional (e.g., x-y coordinate plane) scan plane over the particle. The semantics system 100 may control placement of the scan plane over the particle. For example, in one aspect, the semantics system 100 adjusts a field of view of the TEM microscope by modifying the placement of the scan plane over the image. As one example, consider FIG. 2, which illustrates an example of the particle image 160. As shown, a particle 200 is depicted within an image having dimensions in an x-y coordinate plane.

Moreover, each separate point in the scan plane represents a detection by the TEM microscope that the semantics system 100 uses to construct the particle image 160. As noted, the TEM microscope produces a diffraction pattern (e.g., diffraction pattern 210) at each scan point of the particle representing how the particle scatters the electrons at that corresponding point. Thus, the particle image 160 is comprised of a plurality of diffraction patterns with each separate diffraction pattern being associated with a separate pixel in the image 160. For example, in an image having 1000 pixels by 1000 pixels, the image 160 would include 1,000,000 separate diffraction patterns assuming the image 160 is completely consumed by the particle.

Figure 2:
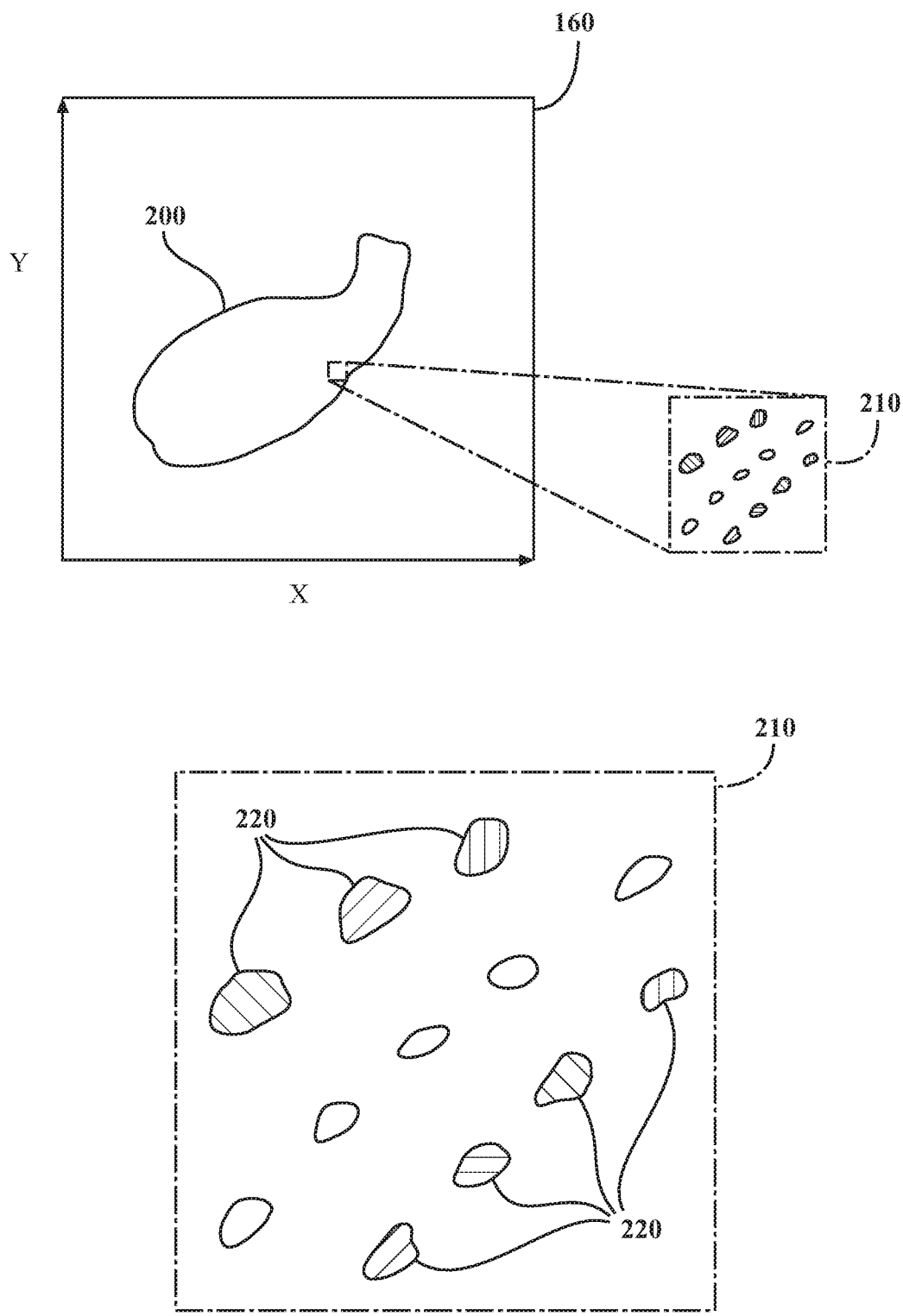
FIG. 2 illustrates one example of a particle image that includes diffraction patterns.

The diffraction patterns themselves are indicative of different traits of the particle at the associated locations as embodied by the electrons scattering/deflecting in different ways to produce the diffraction patterns. In one embodiment, the diffraction patterns are 512×512 pixels with separate pixels of the diffraction pattern indicating detection points of electrons on the detector. As one example, the diffraction pattern 210 of FIG. 2 represents a single detection point on the particle 200 and the separate points 220 illustrated within the diffraction pattern 210 are representative of one or more electrons detected by the TEM microscope. Accordingly, the diffraction pattern represents positions, and spacings of detected electrons as scattered by a probed location on the particle. The various patterns depicted by the diffraction patterns are indicative of various properties of the particle at the particular location such as crystallographic structure, chemical properties, density, energy, and so on. Accordingly, the particle image 160 includes an aggregation of many diffraction patterns that embody characteristics of the particle.

With further reference to the semantics system 100, in one embodiment, the segmentation module 130 includes instructions that function to control the processor 110 to generate the segmented image 180 from the particle image 160 using at least the semantics model 170. For example, the segmentation module 130 processes the particle image 160 using the semantics model 170, which analyzes the particle image 160 according to internal understandings developed through training the semantics model 170 on, for example, similar pre-labeled data.

Thus, prior to analyzing the particle image 160 to identify the characteristics, the semantics system 100 trains the semantics model 170. Training the semantics model 170 is generally undertaken as an initialization step but may also occur in an ongoing manner. The particular approach to training the semantics model 170 undertaken by the system 100 can take different forms such as supervised, self-supervised, or unsupervised. The various approaches employ different mechanisms such as using the noted training data that includes pre-applied labels in contrast to unsupervised forms that employ, for example, adversarial algorithms (e.g., discriminators) that challenge results produced by the semantics model 170 according to a defined metric.

In either case, the semantics system 100 trains the semantics model 170 to develop an internal understanding of the particle images 160 that the semantics system 100 leverages to improve identification of the characteristics of the associated particles. The semantics model 170 embodies the internal understandings through developing various internal weights of different nodes along with, for example, adjusting parameters of other functions and internal determinations. In one approach, to train the semantics model 170, the semantics system 100 determines errors between pre-labeled portions of an image and results provided by the semantics model 170, which are then backpropagated into the semantics model 170 in order to adjust internal values. Additionally, the semantics model 170 is, for example, a convolutional neural network (CNN) or other machine learning algorithm that recognizes aspects of an image to produce identifications therefrom. Thus, the segmentation module 130 in concert with the semantics model 170 perform semantic segmentation over the particle image 160 in order to identify characteristics of the particle associated with the individual pixels and group the pixels into subregions of like kinds. It should be appreciated that in various embodiments, the segmentation module 130.

Figure 3:
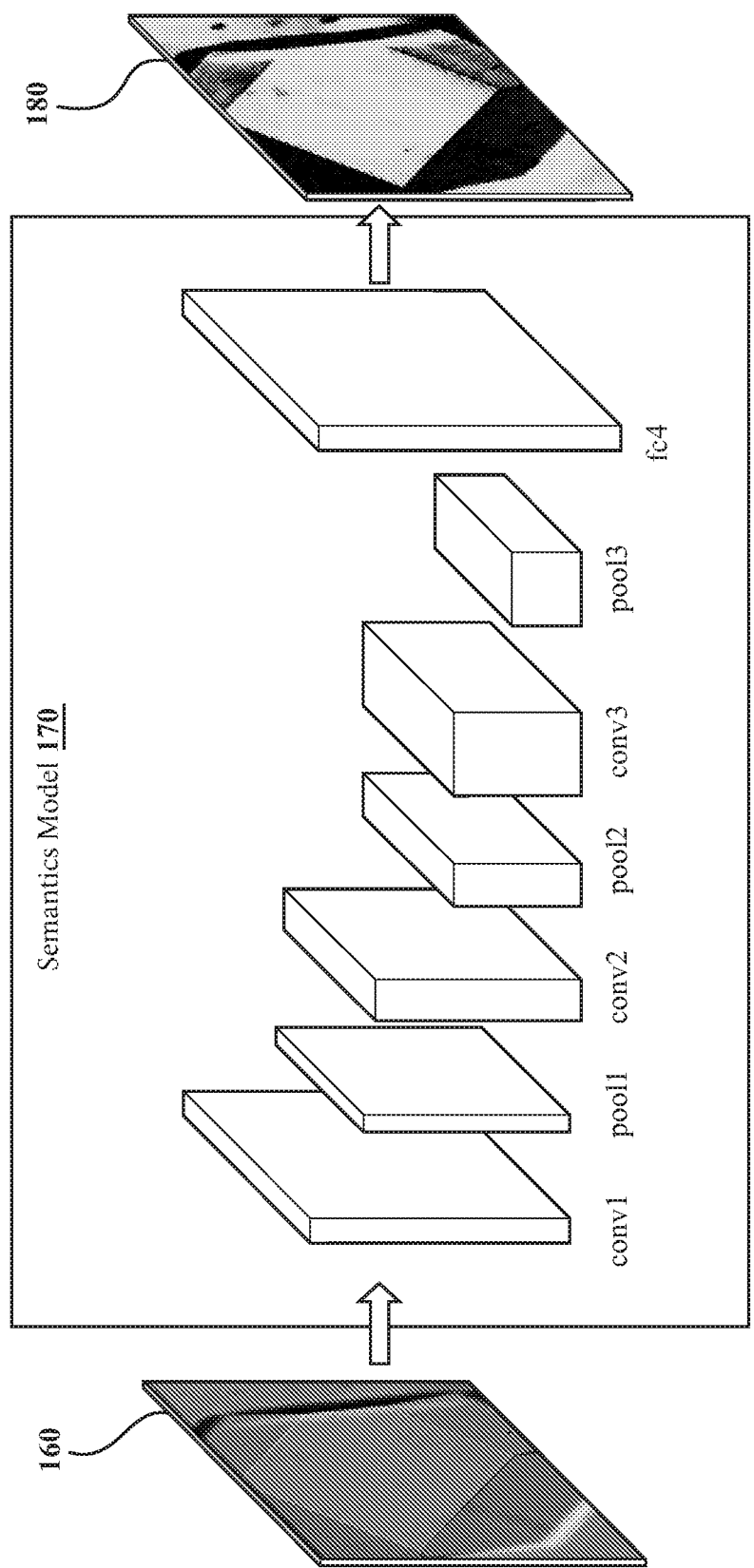
FIG. 3 illustrates an example of a network architecture of a model that can be employed to analyze particle images.

FIG. 3, illustrates one example of the semantics model 170 as may be implemented by the semantics system 100. As illustrated in FIG. 2, the semantics model 170 includes multiple different internal layers. The layers of the semantics model 170 can include different combinations of convolutional layers, pooling layers, ReLU layers, activation functions, skip connections between layers, pre-processing layers (e.g., size and/or color scale adjustments), post-processing layers (e.g., resolution adjustments), classification/fully connected layers, and so on. FIG. 2 illustrates an exemplary configuration that is in the spirit of the present approach but is not intended as a limiting example. The illustrated form of the semantics model 170 includes convolutional layers (i.e., conv1, conv2, conv3) paired with pooling layers (i.e., pool1, pool2, pool3). The model 170 is further shown with a single fully connected layer (i.e., fc4) that provides the classifications of the pixels to generate the segmented image 180. Thus, while the illustrated configuration generally describes a CNN, the semantics model 170 as implemented in the semantics system 100 may employ a different configuration of layers.

For example, while not illustrated, the present approach may initially include a deconvolution that expands the individual pixels to represent the underlying diffraction patterns. Thus, as an initial processing step within the semantics model 170, the segmentation module 130, in one approach, implements the semantics model 170 to initially expand the pixels by 512×512 to fully represent the underlying diffraction patterns. Alternatively, the semantics model 170 may include multiple deep learning networks with a first network trained to identify/classify diffraction patterns according to associated characteristics and a second network trained to identify/classify groups of pixels according to labels specifying the identified underlying diffraction patterns. In still further embodiments, the semantics model 170 includes a third classifier to identify semantics from a segmented image 180 produced by other aspects of the semantics model 170. Whichever approach is employed within the network architecture of the semantics model 170, the segmentation module 130 implements the semantics model 170 to accept the particle image 160 as an electronic input, process the image 160 according to the configuration of layers and learned weightings/parameters, and produce a segmented image 180 as an electronic output thereof.

The segmented image 180 represents at least subregions/groups within the particle image 160 where pixels/diffraction patterns indicate corresponding locations of the particle that have like characteristics either overall or in combination. That is, the segmentation module 130 uses the semantics model 170 to identify which areas of the particle image 160 have similar characteristics. The result of this analysis by the module 130 is the segmented image 180 which is labeled according to the characteristics and subregions. As a general matter, the segmentation module 130 labels each pixel in the particle image 160 to identify characteristics of the locations associated with the pixels and also groups the pixels according to the characteristics. Thus, in the simplest form, subregions are comprised of pixels having like characteristics, whereas in more complex forms, the semantics model 170 identifies combinations of pixels that define subregions have particular characteristics (e.g., combinations of two or more pixels of different types/characteristics). That is, in one embodiment, the subregions may have varying combinations of pixels depending on aspects identified by the semantics model 170 as learned through the training process.

Figure 4:
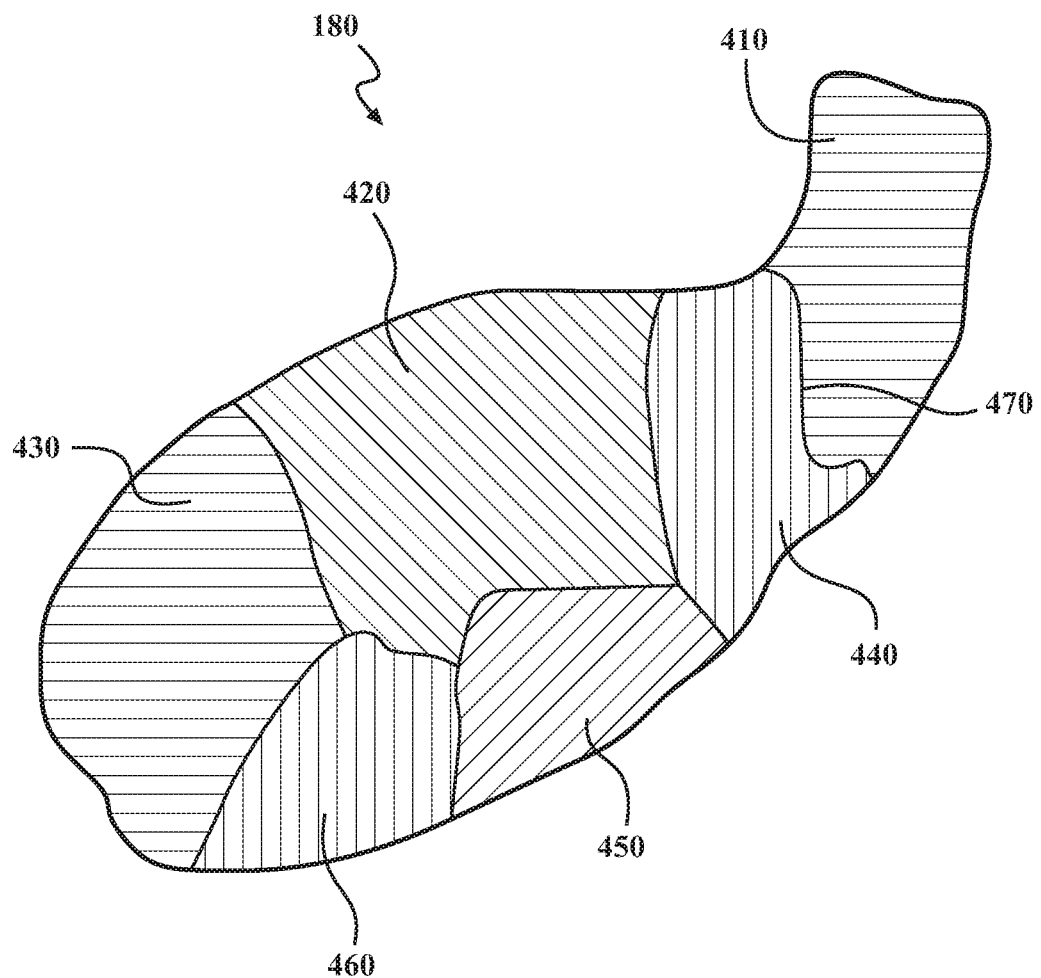
FIG. 4 illustrates one example of a segmented image.

One example of the segmented image 180 is illustrated in FIG. 4. As shown, the segmented image 180 of FIG. 4 includes a plurality of subregions 410, 420, 430, 440, 450, and 460, which are divided by boundaries such as boundary 470. Thus, the bounded subregions generally include pixels having similar characteristics and thus map to locations on the particle having similar characteristics. The segmented image 180 intrinsically indicates boundaries between abutting subregions having distinct characteristics. Although, the segmentation module 130, in one embodiment, further emphasizes/identifies the boundaries with particularity by integrating additional labels along such boundaries.

Moreover, the particular characteristics include, for example, crystallographic parameters, physical structure, chemical identity, electronic structure, material density, electron phase shift/spin, and other traits that are embodied within the particle image 160 or derived from relationships embodied within areas of various characteristics. The resulting segmented image 180 identifies the various characteristics of the underlying particle, which can then be leveraged by further modules to infer further characteristics (e.g., semantics) of the particle.

Turning to the prediction module 140, in one embodiment, the prediction module 140 includes instructions that function to control the processor 110 to identify semantics of the particle according to at least boundaries between the subregions as depicted in the segmented image 180. In addition to identifying characteristics from the particle image 160, the semantics system 100 leverages relationships identified in the segmented image 180 to infer further aspects about the particle. That is, in one embodiment, the prediction module 140 analyzes the segmented image 180 to predict semantics (i.e., physics) of various aspects of the particle.

For example, the semantics define points of stress/strain in the particle from mismatched abutting subregions (i.e., subregions having different characteristics), electrically resistive regions, weakly bound regions (i.e., chemically bonded), electrically charged regions, and other semantics of the particle. In general, the semantics are aspects that are, for example, indicative of behaviors of the particle in relation to material physics and thus how the particle reacts to various environmental conditions over time, and/or interacts with other particles. Thus the semantics may be indicative of potential points of degradation/weakness, suitability for various purposes (e.g., as a battery component, as a resistive coating, etc.), and so on.

As discussed in greater detail subsequently, the prediction module 140 further includes instructions to predict how a particle reacts to a stimulus. That is, the prediction module 140 implements the stimulus model 190 to process a segmented image (e.g., image 180) from which the stimulus model 190 generates the predicted image 195 that is a segmented image of the same particle but including changes as the model 190 predicts would likely occur in the particle if exposed to the stimulus. Thus, the stimulus model 190 develops an understanding of relationships between characteristics/semantics of a particle and how a stimulus induces changes to the characteristics/semantics and overall structure of the particle. As noted, predicting responses of a particle to the stimulus will be discussed in greater detail after the discussion of generating the semantics for the segmented image 180.

Accordingly, the prediction module 140 analyzes the boundaries according to characteristics of the abutting subregions in order to determine corresponding semantics that correlate with such a boundary. In further aspects, the prediction module 140 further accounts for particular geometries of the boundaries, and/or geometries of the subregions in order to predict the semantics and/or the degree to which the particle exhibits a particular semantic. As one example, geometries of subregions and associated boundaries can influence an extent to which a particular type of semantic is present. That is, a brief/short boundary between to subregions may indicate a relatively weak semantic whereas an extended/large boundary may indicate a stronger semantic or at least probability of a semantic having a particular extent/degree. Moreover, the prediction module 140, in one approach, executes the indicated prediction about the semantics using the semantics model 170 or at least a portion thereof. For example, in one approach, the prediction module 140 is integrated with one or more classification layers that follow the segmentation layers of the semantics model 170.

Of course, in a similar manner as discussed in relation to the identification of the characteristics, the semantics system 100 also, in one embodiment, trains the semantics model 170 to identify the semantics associated with the boundaries. Accordingly, depending on a particular approach to training, the semantics system 100 trains the semantics model 170 using pre-labeled training data that indicates semantics of a depicted particle along with, for example, boundaries and characteristics of associated subregions. Additionally, while the prediction module 140 is discussed as using the semantics model 170, in further aspects, the prediction module 140 implements a second machine learning algorithm that predicts the semantics of the particle from the segmented image 180. Accordingly, the prediction module 140 employs a convolutional neural network or similar machine learning algorithm that analyzes images (e.g., segmented images) and classifies aspects of the images according to information provided therein.

As such, the semantics system 100 functions to identify the characteristics of the particle and the associated semantics when provided with just the particle image 160. In this way, the prediction module 140 further leverages the information about the particle embodied within the particle image 160 to streamline analysis of the particle and extrapolate semantics of the particle from learned correlations.

Figure 5:
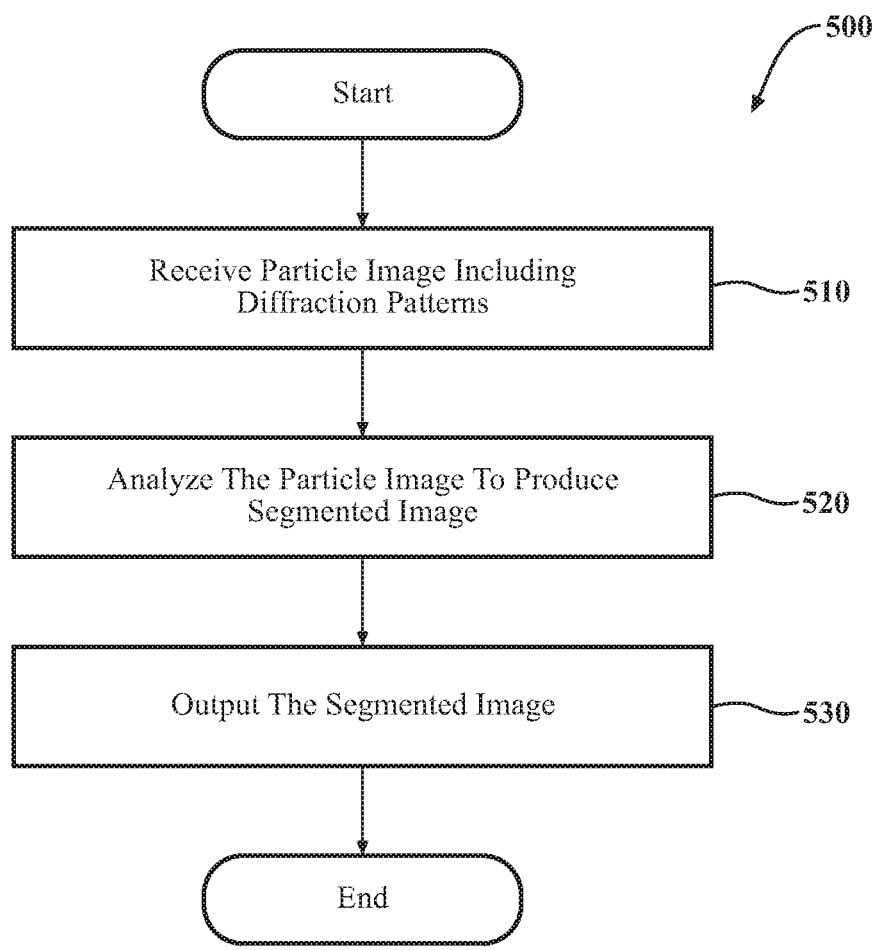
FIG. 5 illustrates one embodiment of a method associated with analyzing images to identify characteristics of an associated particle.
Figure 6:
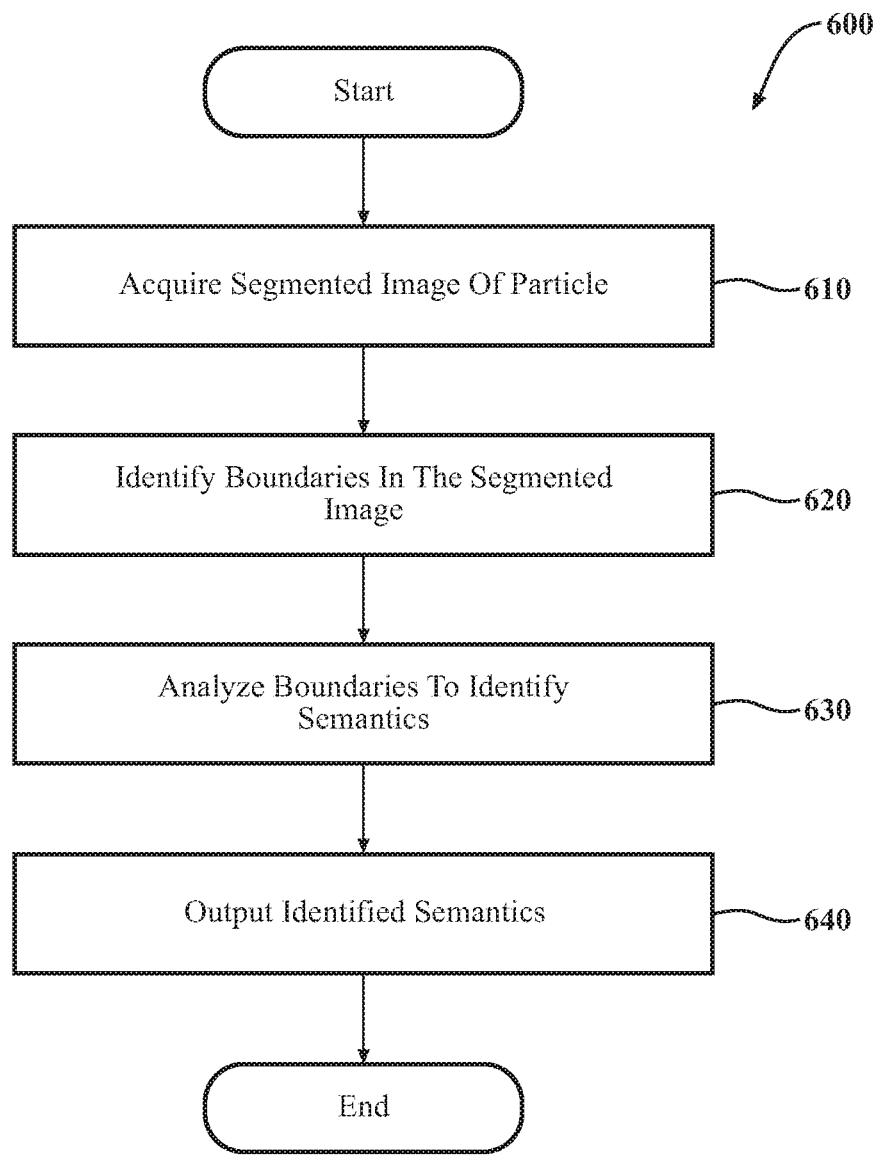
FIG. 6 illustrates one embodiment of a method associated with analyzing segmented images to identify semantics of an associated particle.

Additional aspects of inferring semantics of a particle from a particle image will be discussed in relation to FIGS. 5, and 6. FIG. 5 illustrates a flowchart of a method 500 that is associated with identifying characteristics of a particle as embodied within a particle image (e.g., TEM image 160). FIG. 6 illustrates a method 600 associated with inferring semantics (i.e., physics) of the particle from the segmented image embodying the characteristics of the underlying particle. Methods 500 and 600 will be discussed from the perspective of the semantics system 100 of FIG. 1. While methods 500 and 600 are discussed in combination with the semantics system 100, it should be understood that the methods 500/600 are not limited to being implemented within the semantics system 100 but is instead one example of a system that may implement the methods 500 and 600.

As a point about the initial configuration of the present approach, in one embodiment, the semantics system 100, prior to undertaking the methods 500 and 600, executes a training process to train one or more machine learning algorithms (e.g., semantics model 170). As previously indicated, the semantics system 100 can be implemented to undertake different approaches to training the one or more machine learning algorithms such as unsupervised, supervised, or other suitable approaches. For example, in a supervised approach, the semantics system 100 uses a training data set that is comprised of pre-labeled/segmented particle images. Thus, the semantics system 100 iteratively processes images from the training set according to the methods 500/600 and compares results with the provided labels to assess an error in the output. The semantics system 100 then, for example, backpropagates the errors to adjust internal understanding (i.e., nodal weights and other parameters) of the machine learning algorithm according to a particular error function (e.g., gradient descent). In this way, the semantics system 100 trains the semantics model 170 to recognize the desired aspects of the particle through analysis of the associated image.

At 510, the semantics system 100 receives the particle image 160. The semantics system 100 can receive the particle image 160 through either active acquisition (i.e., controlling a device to acquire the particle image 160 of the particle) or through communication of the particle image 160 via a data communication link. Thus, in one approach, the semantics system 100 actively controls a transmission electron microscope to scan a sample and produce the particle image 160 therefrom. In further aspects, the particle image 160 is electronically stored as a collection of images of the particle or other particles acquired under, for example, various conditions. Thus, the acquisition of the particle image 160 can be either an active task or separate process.

In either case, as previously mentioned, the particle image 160 is comprised of a multiplicity of pixels (e.g., 1024×1024, 2048×2048, or another suitable resolution) that can each include a separate diffraction pattern. Thus, the particle image 160 represents a dense/fine-grained portrayal of information about an associated particle especially considering that the diffraction patterns can separately have resolutions of 512×512. Of course, while the diffraction patterns are discussed as separate patterns/images that comprise pixels of the image 160, in one embodiment, the diffraction patterns are provided with differing resolutions depending on a particular detector employed to detect scattered electrons.

At 520, the segmentation module 130 analyzes the particle image 160. In one embodiment, the segmentation module 130 analyzes the particle image 130 by convolving one or more filters over the image 160 to identify features embodied therein. The process of convolving filters and recognizing characteristics of the particle is, for example, embodied within the semantics model 170 and may be supported by the functionality of the segmentation module 130. That is, the segmentation module 130 uses the semantics model 170, which includes a machine learning algorithm such as a CNN, to analyze the particle image 160. The analysis of the image 160 can involve a multiplicity of separate processes from pre-processing steps, to filtering/convolving, pooling, classification, up-sampling, and so on.

In one approach, the segmentation module 130 performs pre-processing on the image 160 to improve the form in which the image 160 is provided into the semantics model 170. Thus, the segmentation module 130 may adjust colors, correct distortions or perform other pre-processing functions such as deconvolving the image 160 to fully represent the diffraction patterns in place of the separate pixels. Moreover, in one approach, instead of deconvolving the image 160, the segmentation module 130 performs an initial classification pass over the image 160 by processing each separate diffraction pattern. For example, the segmentation module 130 processes the diffraction patterns independently to classify one or more characteristics of the particle identified therein. That is, instead of initially processing the image 160 as a single unit, the segmentation module 130 along with an architecture of the semantics model 170 are configured to separately process the diffraction patterns and use the generated classification to define each pixel of the image 160 according to identified aspects of the corresponding diffraction patterns.

A resulting intermediate image, in one embodiment, includes representations of the diffraction patterns at corresponding pixel locations. The intermediate image includes, for example, determinations about the diffraction patterns identifying associated characteristics of the particle that replace the diffraction patterns in the image 160. Thus, in one approach, the segmentation module 130 initially processes the diffraction patterns to produce the intermediate image using annotations identifying the characteristics. The annotations within the intermediate image effectively simplify the particle image 160 into a refined representation with characteristics of correlating locations on the particle being represented within corresponding pixels in place of the diffraction patterns.

Thus, the segmentation module 130 can then proceed with performing semantic segmentation over the intermediate image (i.e., partially processed particle image 160) to identify the subregions of characteristics within the particle. Otherwise, the segmentation module 130 produces the intermediate image from the pre-processed image 160 that, for example, includes the diffraction patterns in a deconvolved/integrated form or another suitable form for processing by the segmentation module 130 and the semantics model 170.

In either case, the segmentation module 130 uses the semantics model 170 to analyze the partially processed particle image 160 in order to group similarly situated pixels into subregions. The segmentation module 130 defines the subregions according to groups of pixels in the particle image 160 having similar characteristics. Thus, the segmentation module 130 generally forms the subregions as learned from training on other particle images with labeled pixels and subregions. Of course, in further approaches, the segmentation module 130 may define the subregions according to a "best-fit" for separate groups of pixels.

As such, in various implementations, the segmentation module 130 can accept varying levels of conformity/heterogeneity in the different subregions. In other words, the segmentation module 130 may group the pixels according to one or more approaches that result in the subregions generally defining areas in the particle that have similar characteristics but may include one or more pixels with differing characteristics as may be necessary to form the subregions. Of course, the particular approach may be customized such that subregions are wholly exclusive and group only like kind characteristics or are selectively inclusive to a defined extent. In still further aspects, as noted, the subregions are defined according to learned representations of how the subregions generally occur across a population of particles as exhibited in the training data.

Moreover, the segmentation module 130, in one embodiment, undertakes further refinement of the subregions by rescanning areas proximate to boundaries between subregions with the microscope. That is, if a particular pixel overlaps a boundary between regions, the segmentation module 130 can adjust coordinates of nearby pixels (e.g., slide the coordinate plane) such that the overlap is minimized and thus the pixel is wholly within a particular subregion. By adjusting the positioning of a pixel to conform with a boundary between subregions, an associated diffraction pattern that the semantics system 100 acquires through re-imaging the particle better represents characteristics of the pixel abutting the boundary instead of including characteristics of two different subregions. Thus, while the segmentation module 130 may not increase a resolution to further resolve characteristics of a pixel, the segmentation module 130, in one embodiment, does further resolve the pixel through adjustment of overlaps between different pixels that neighbor a boundary.

At 530, the segmentation module 130 provides the segmented image 180 as an electronic output. In one embodiment, the segmented image 180 is provided to the prediction module 140. Alternatively, or additionally, in one approach, the segmented image 180 is stored in the database 150 or another suitable electronic data store. In either case, the segmentation module 130 provides the segmented image 180 with associated labels that provide, for example, a pixel-by-pixel indication correlating with the particle image 160 of characteristics associated with the pixel (e.g., physical trait and corresponding subregion).

Accordingly, the semantics system 100 loads or otherwise receives the training set that is comprised of the custom images as previously described. In one embodiment, the semantics system 100 generates the training set and stores the training set until needed. Thus, the semantics system 100 loads the training set which is comprised of a plurality of custom images. As previously mentioned, the custom images may be initially generated to be directed at depictions of subject matter that relates to a particular task of a module being trained. Thus, the custom images can depict a particular selected subject matter that relates to training the module on a specific task (e.g., obstacle detection, collision avoidance, etc.).

Turning now to the method 600, as described above, as an initialization process, the semantics system 100, in one embodiment, trains the semantics model 170 or another machine learning algorithm to identify semantics of the particle by analyzing the segmented image 180. In particular, the semantics system 100 trains a machine learning algorithm or at least portion thereof to identify semantics of the particle according to attributes of boundaries between subregions. Thus, in one approach, the semantics system 100 uses segmented images with labels identifying semantics in relation to individual and/or combinations of boundaries. Moreover, the individual boundaries defining semantics according to characteristics of abutting subregions. Thus, the semantics system 100, in one approach, trains the semantics model 170 or another machine learning algorithm to classify the semantics according to attributes of the boundaries.

At 610, the prediction module 140 acquires the segmented image 180. As previously described, the segmented image 180 is segmented into subregions grouping locations on the particle of similar characteristics. In general, the prediction module 140 can accept the segmented image 180 directly from the segmentation module 130 or from a data store that includes a set of images that were previously segmented. In either case, the input to the prediction module 140 is an image including pixels labeled according to characteristics correlating with associated locations on the particle.

At 620, the prediction module 140 identifies boundaries in the segmented image 180 between subregions. In one embodiment, the prediction module 140 maps the boundaries by identifying where distinct subregions interface. The prediction module 140 can then, in one approach, annotate the separate boundaries according to particular characteristics such as types of the abutting subregions (i.e., labeled characteristics), particular geometries, and/or other notable attributes. Of course, in further aspects, the prediction module 140 performs the noted analysis at 620 according to internal functions of the semantics model 170 and learned/trained understandings embodied therein for identifying various aspects of the segmented image 180.

At 630, the prediction module 140 identifies semantics of the particle. In one embodiment, the prediction module 140 analyzes at least the boundaries between the subregions to infer the semantics of the particle. As previously mentioned, the semantics define expected behaviors of the particle in relation to material physics such as electrical properties, mechanical stresses, electrochemical properties, and so on. Thus, the boundaries between regions of the particle having different characteristics generally inform how the particle behaves, i.e. the semantics/physics of how the particle exists. Consequently, the prediction module 140 in combination with the semantics model 170 or another purpose-built machine learning algorithm process the segmented image 180, and, in particular, information about the boundaries to predict the semantics of the particle. Thus, the prediction module 140 considers the attributes of the boundaries to derive the semantics through the learned understanding of the semantics model 170.

It should be appreciated that while the semantics are generally referenced in relation to the particle as a whole, in one embodiment, the prediction module 140 indicates the semantics with particularity in relation to specific boundaries and/or subregions associated with the boundaries. Additionally, it should be noted that the semantics model 170 can include additional classification layers that add additional functionality over the basic segmentation functionality discussed in relation to FIG. 5 for the purpose of inferring the semantics. Moreover, as indicated, the prediction module 140, in one approach, instead implements.

At 640, the prediction module 140 generates an electronic output identifying the semantics. In one embodiment, the prediction module 140 generates the electronic output by integrating the semantics as labels within the segmented image 180. That is, the prediction module 140 modifies the segmented image 180 to integrally combine the semantics into the image 180. In this way, the semantics system 100 provides a streamlined mechanism for ascertaining various aspects of a particle from a simple image of the particle.

As previously noted, while the semantics of the particle are individually useful for further understanding aspects of the particle overall in order to facilitate improving the process of selection for material engineering, understanding potential performance constraints of current materials, and so on, this information can also be useful in the context of prediction through machine learning. That is, the semantics system 100 can further use the information about the particle to learn correlations between semantics and various stresses/stimuli in order predict how different particles change when subjected to the stresses/stimuli.

Figure 8:
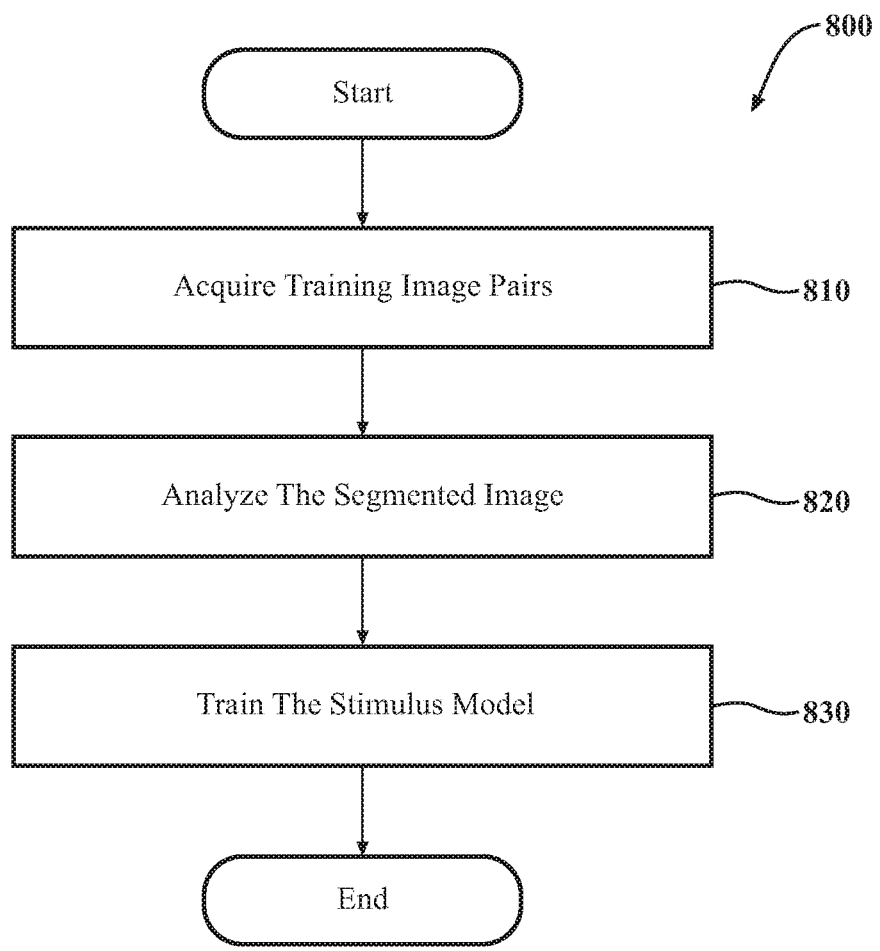
FIG. 8 illustrates one embodiment of a method associated with training a stimulus model to predict changes to a particle according to a stimulus.
Figure 9:
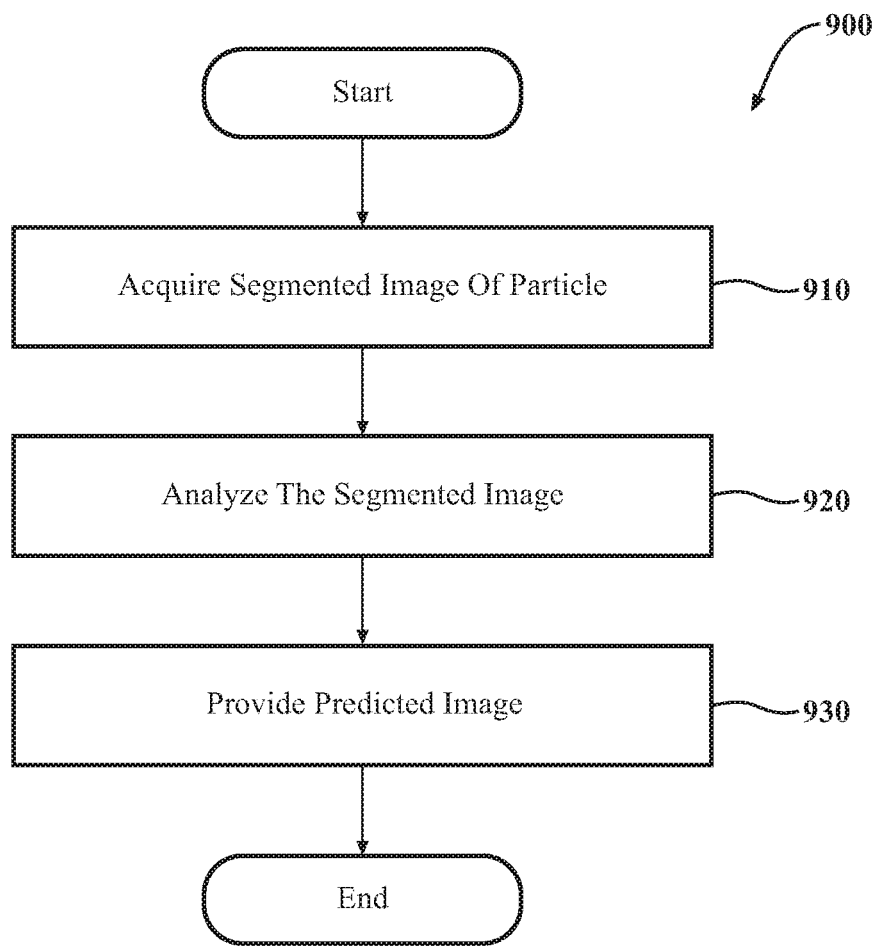
FIG. 9 illustrates one embodiment of a method associated with analyzing segmented images to identify semantics of an associated particle.

Additional aspects of predicting changes induced within a particle by a stimulus will be discussed in relation to FIGS. 8, and 9. FIG. 8 illustrates a flowchart of a method 800 that is associated with training a model such as the stimulus model 190 to predict changes in a particle according to a stimulus. FIG. 9 illustrates a method 900 associated with predicting changes in a particle according to a stimulus. Methods 800 and 900 will be discussed from the perspective of the semantics system 100 of FIG. 1. While methods 800 and 900 are discussed in combination with the semantics system 100, it should be understood that the methods 800/900 are not limited to being implemented within the semantics system 100 but is instead one example of a system that may implement the methods 800 and 900.

Accordingly, in one approach, the implementation of such functionality includes a process for training the stimulus model 190 to produce predicted images such as the predicted image 195 that illustrate changes to the particle by the stimulus. As such, for purposes of the present discussion it should be appreciated that the semantics system 100 trains the stimulus model 190 to predict changes according to a single stimulus or combination of stimuli. That is, the stimulus model 190 predicts changes produced by an occurrence of the stimulus as opposed to multiple different stimuli individually. For example, the stimulus model 190 may be trained to predict changes that occur due to one of mechanical stress, high-temperature exposure, electrochemical exposure, and so on. In still further examples, the semantics system 100 can train the stimulus model 190 to predict changes according to a combination of two or more stimuli such as mechanical stress and high-temperature exposure together.

However, the stimulus model 190 does not generally discriminate between separate stimuli and thus provides predictions according to the singular stimulus or combination of stimuli for which it is trained. It should be appreciated that while the stimulus model 190 is discussed as predicting changes for a single stimulus or combined stimuli, in one approach, the semantics system 100 implements the stimulus model 190 as separate instances for separate stimulus. That is, the semantics system 100 separately trains and executes multiple instances of the model 190 with each separate instance corresponding with a different stimulus. Thus, while the model 190 is generally illustrated and discussed as a single discrete model, it should be appreciated that the semantics system 100, in various embodiments, implements multiple separate instances of the model 190 in order to predict changes according to different stimuli and combinations thereof.

Figure 7:
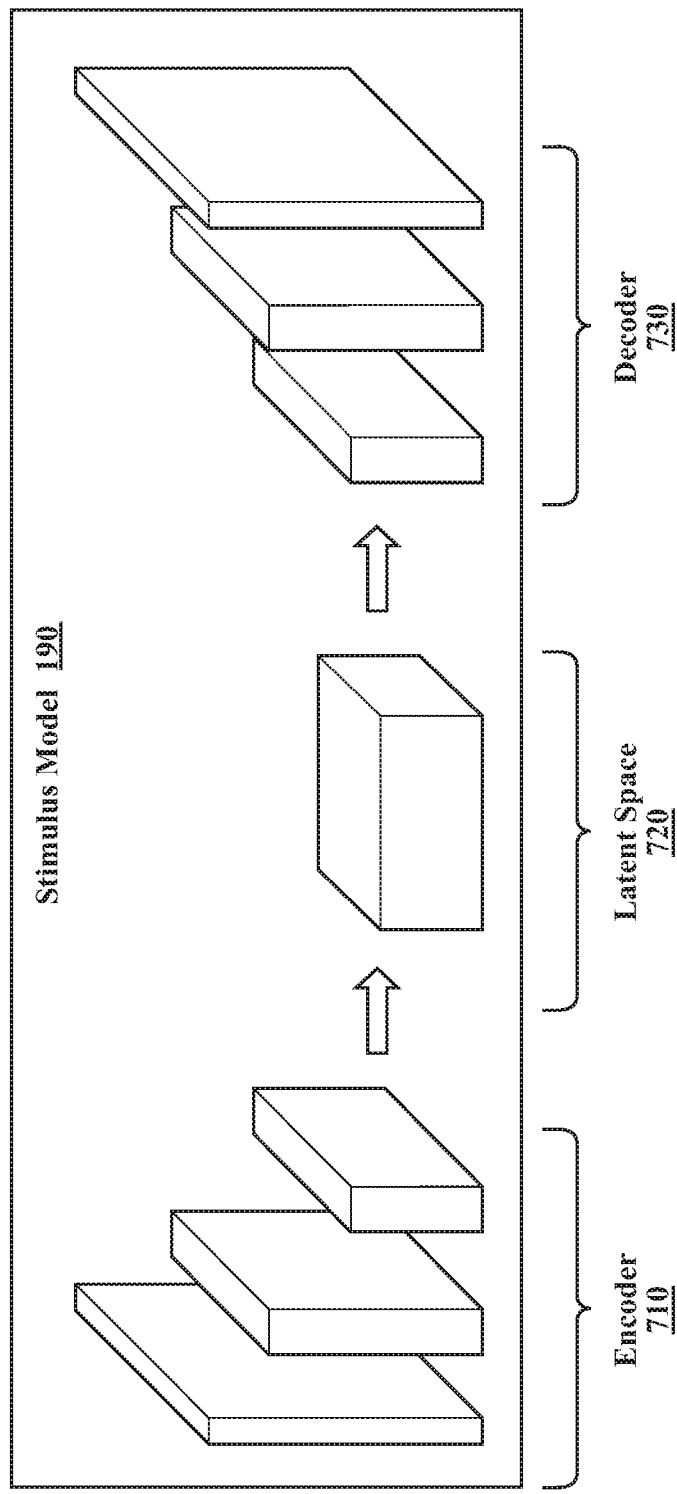
FIG. 7 illustrates an example of a network architecture of a stimulus model that predicts changes to particles associated with exposure to a stimulus.

As further explanation of the stimulus model 190, briefly consider FIG. 7, which illustrates one example of basic components of the model 190. In general, the stimulus model 190 is a generative machine learning algorithm that accepts an electronic input in the form of, for example, the segmented image 180 and generates an electronic output in the form of the predicted image 195. Thus, in various implementations, the stimulus model 190 may take different forms such as a generative adversarial network (GAN) but generally functions to predict the effects of a stimulus on a particle by generating the predicted image 195 to indicate the effects by depicting the particle in a post-stimulus state. That is, the stimulus model 190 generates the predicted image 195 to include characteristics of the post-stimulus particle including subregions and semantics as included within the segmented image 180. In particular, the stimulus model 190, in various implementations, is a variational-autoencoder (VAE), a VAE-GAN, or another suitable network that accepts the noted images as inputs and provides images of the transformed particle as the output.

As illustrated in FIG. 7, the stimulus model 190 includes an encoder 710, a latent space 720, and a decoder 730. Thus, the general configuration shown in FIG. 7 is of a VAE. The stimulus model 190 may include further components such as a discriminator, and additional layers (e.g., convolutional layers, de-convolutional layers, ReLU (rectified linear unit) layers, pooling layers, etc.) within the various components. In further aspects, the stimulus model 190 includes different components than shown in FIG. 7. For example, the model 190 may not include the encoder 710 and the latent space 720, and instead can include a discriminator along with the decoder 730 to form a GAN. In such an approach, the stimulus model 190 may process a combination of labels from the segmented image 180 instead of the segmented image 180 itself. Moreover, as discussed in relation to the semantics model 170, the stimulus model 190, in one or more embodiments, also includes pre-processing and/or post-processing functions to improve the operation of the model 190.

Turning now to the method 800 and the training of the stimulus model 190, at 810, the semantics system 100 acquires a training data set. In one approach, the training data set includes pairs of images for a particle. One image in a pair is of the particle in a pre-stimulus state, and the other image in the pair is of the particle in the post-stimulus state. Moreover, the images are segmented images that include, for example, labels of the characteristics and associated semantics. Thus, a training set of images for the model 190 includes pre and post stimulus images of particles for a single stimulus or combination of stimuli as previously specified.

Consequently, the semantics system 100 can control the TEM microscope to acquire images before and after the stimulus is applied to the particle in order to generate pairs of particle images (e.g., images 160). Alternatively, the pairs of particle images are generated out-of-band and may be electronically provided to the semantics system 100. The semantics system 100 can then process the pre and post stimulus particle images to generate corresponding segmented images that include the characteristics/semantics of the particle in both states. In this way, the system 100 can acquire the training data set. Of course, in further embodiments, the segmented images that form the training data set are instead acquired through an out-of-band process where the images are independently acquired and grouped together.

In either case, at 820, the prediction module 140 analyzes the pre-stimulus segmented image from the training set according to a current training. That is, the prediction module 140 analyzes the pre-stimulus image using the stimulus model 190 to produce a predicted image. However, while the semantics system 100 may perform an initial activation of the stimulus model 190 using one or more activation functions (e.g., ReLU) to set, for example, nodal weights (e.g., hyper parameters), the stimulus model 190 achieves a steady state for performing reliable predictions after iteratively training on a plurality of images.

Thus, at 830, the semantics system 100 trains the stimulus model 190. In one embodiment, the semantics system 100 determines an error/loss between the generated predicted image 195 and the post stimulus particle image from the training data. Thus, the semantics system 190 then proceeds to adjust internal values of the stimulus model 190 according to the error. In this way, the semantics system 100 iteratively trains the model 190 over the training data set. In further approaches, the precise form of the training may vary from the above-described approach. For example, the semantics system 100 may feed the predicted image 195 from the untrained model 190 and the post-stimulus image from the training set into a discriminator in order to train the discriminator on differentiating between desired images from a generator. As such, the discriminator can then actively adjust the generator of the model 190. Once the semantics system 100 trains the stimulus model 190 to predict changes according to a prescribed stimulus or combination of stimuli, then the prediction module 140 employs the stimulus model 190 to generate the predicted image 195 for unpaired images (e.g., non-training data).

At 910, the segmentation module 130 receives a segmented image 180 of a particle. As discussed previously in relation to methods 500 and 600, the segmented image 180 identifies at least semantics of the particle and associated characteristics according to subregions of the particle. Thus, the segmentation module 130, in one approach, receives the segmented image 180 in response to the semantics system 100 generating the segmented image 180 from the particle image 160. Alternatively, the segmentation module 130 loads the segmented image 180 into a working memory (e.g., memory 120) for processing by the prediction module 140. In either case, the segmented image 180 represents a pre-stimulus form of the particle upon which the system 100 is to act in order to predict how a stimulus changes the particle.

At 920, the prediction module 140 analyzes the segmented image 180 using the stimulus model 190. As an additional point about the module 140 and the model 190, in one embodiment, the prediction module 140 and the stimulus model 190 are integrated together or at least partially integrated with the prediction module 140 which implements, for example, logic of the stimulus model 190 in order to facilitate the functionality of the model 190. It should be appreciated that the stimulus model 190 is generally comprised of logic to implement the functionality along with data structures that store other aspects such as learned nodal weights, and so on. Thus, the prediction module 140 and the stimulus model 190 are generally considered to be integrated together for purposes of this discussion.

In either case, the prediction module 140 uses the model 190 to predict changes in the particle associated with applying the stimulus to the particle. That is, the prediction module 140 analyzes the segmented image according to a learned understanding of the stimulus and effects of the stimulus on particles as embodied within the stimulus model 190. Thus, the prediction module 140 in concert with the stimulus model 190 consider present configurations of the characteristics and semantics of the particle as embodied within the segmented image 180 in order to predict how the stimulus changes the noted aspects.

For example, as previously noted, the stimulus may be one of or a combination of heat, mechanical stress, chemical exposure, electrochemical effects, or other applicable stimuli. Accordingly, with an awareness of the ways in which various semantics/characteristics interact with the applied stimulus the prediction module 140 predicts the changes induced within the particle. The changes are generally modifications to physical structure (e.g., crystal structure, chemical bonds, etc.), morphing/movement within regions of characteristics, changes to boundaries between subregions (e.g., shapes, types, etc.), changes in semantics (i.e., physics) whether from the changes to the other characteristics or in isolation, and so on. Consequently, the prediction module 140 and the stimulus model 190 provide for identifying the changes without actually subjecting the particle to the stimulus.

Moreover, the stimulus model 190 provides for predicting the changes through generating the predicted image 195 via the generative components of the model 190. Thus, the stimulus model 190 provides the predicted changes through visual representation in the form of the image 195, which is, in one approach, provided as a segmented image (i.e., image of the particle identifying local and overall characteristics). The inferences embodied in the stimulus model 190 provide for predicting how the characteristics/semantics of the particle respond to the stimulus via correlations learned from the pre-stimulus and post-stimulus images of similar particles.

At 930, the prediction module 140 provides the predicted image 195 as an electronic output. The prediction module 140, in one embodiment, provides the predicted image 195 to an electronic data store for subsequent review. In further examples, the prediction module 140 provides the predicted image 195 to a rendering engine or other visualization mechanism in order to electronically display the predicted image 195. In either case, the predicted image 195 is generated in the spirit of the input image (i.e., segmented image 180). Accordingly, the predicted image 195 generally includes subregions of characteristics and identifiers of associated semantics. In one embodiment, the predicted image 195 is generated by the stimulus model 190 to include a pixel-level representation of characteristics of the particle post stimulus that is analogous to, for example, a segmented image as may be produced from the post-stimulus particle if such particle where imaged by the TEM microscope and subsequently analyzed by the system 100 to produce a corresponding segmented image.

Figure 10:
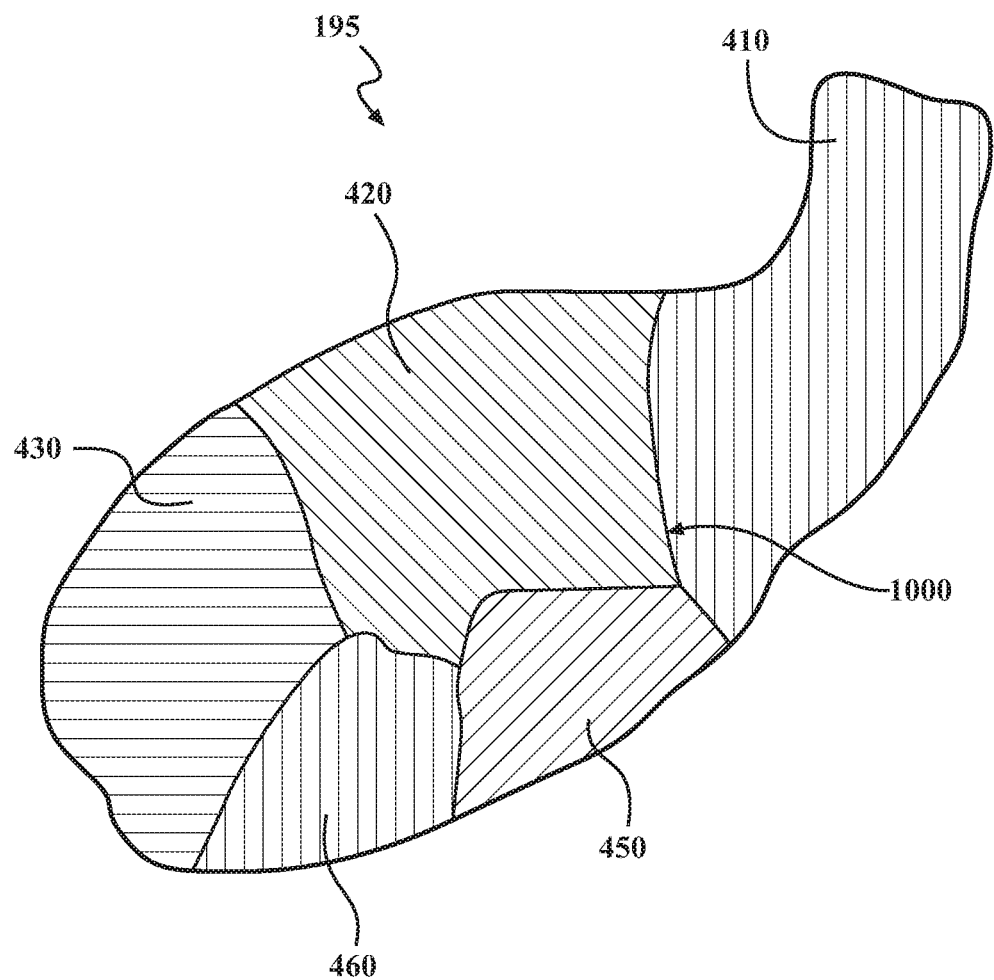
FIG. 10 illustrates one example of a predicted image for a particle as may be produced by the systems and methods disclosed herein.

As further explanation of the predicted image 195, consider FIG. 10, which illustrates one example. As shown in FIG. 10, the predicted image 195 is a representation of an image produced by the stimulus model 190 corresponding with a particle represented by the segmented image 180 of FIG. 4 being exposed to a stimulus such as mechanical stress. Thus, as illustrated in FIG. 10, the predicted image 195 includes subregions that are generally similar to the segmented image 180 but have been altered according to predicted changes of the stimulus. For example, subregion 440 is no longer present but has merged with subregion 410. Thus, the corresponding boundary 470 that was previously present is now also gone and boundary 1000 defines an interface between region 410 and regions 420 and 450. The remaining regions 420, 430, 460, and 450 have shifted slightly in overall shape but otherwise remain. In further aspects, the characteristics of one or more of the remaining regions (e.g., region 410) may change due to the stimulus. In either case, as shown in FIG. 10, the predicted image 195 is generated by the semantics system 100 to parallel the segmented image 180 in overall format while conveying changes likely to be induced by the stimulus. In this way, the semantics system 100 improves the analysis of particles by leveraging machine learning to develop understandings of relationships between a stimulus and characteristics/structure of a particle and how those characteristics/structures change.

FIG. 1 will now be discussed in further detail as an example environment within which the system and methods disclosed herein may operate. The semantics system 100 can include one or more processors. In one or more arrangements, the processor(s) can be a main processor of the semantics system 100. For instance, the processor(s) can be an electronic control unit (ECU). The semantics system 100 can include one or more data stores for storing one or more types of data. The data store can include volatile and/or non-volatile memory. Examples of suitable data stores include RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The data store can be a component of the processor(s), or the data store can be operably connected to the processor(s) for use thereby. The term "operably connected," as used throughout this description, can include direct or indirect connections, including connections without direct physical contact, electrical connections, optical connections, and so on.

The one or more data stores can include sensor data or other electronic data that is processed by a processor of the semantics system 100 at the direction of one or more modules implementing disclosed methods of the present disclosure. In this context, "electronic data" broadly refers to information produced by the semantics system 100 and that is received, for example, from various electronic sensors, electronic communications, electronic interactions with control systems and/or devices, and so on.

The semantics system 100 can include one or more modules. The modules can be implemented as computer-readable program code that, when executed by a processor, implement one or more of the various processes/methods described herein. One or more of the modules can be a component of the processor(s), or one or more of the modules can be executed on and/or distributed among other processing systems to which the processor(s) is operably connected. Moreover, in further examples, in one or more of the modules are embodied as ASICS, FPGAs, task-specific microprocessors, control units (e.g., ECU), and so on. The modules can include instructions (e.g., program logic) executable by one or more processor(s) and/or the module itself. Alternatively, or in addition, one or more data stores may include instructions that embody the modules.

In one or more arrangements, one or more of the modules described herein can include artificial or computational intelligence elements, e.g., neural network, fuzzy logic or other machine learning algorithms. Further, in one or more arrangements, one or more of the modules can be distributed among a plurality of the modules described herein. In one or more arrangements, two or more of the modules described herein can be combined into a single module.

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-10, but the embodiments are not limited to the illustrated structure or application.

The flowcharts and block diagrams in the figures illustrate the architecture, functionality, and operation of possible implementations of systems, methods, and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across multiple interconnected processing systems. As a general matter, an electronic processing system or another apparatus adapted for carrying out the methods described herein may implement the disclosed approach(es). One combination of hardware and software may include a processing system with computer-usable program code that, when being loaded and executed, controls the processing system such that the processing system carries out the methods described herein. The systems, components and/or processes also can be embedded in a computer-readable storage mediums, such as a computer program product or other electronic storage device(s) that are capable of accommodating such computer program code. Furthermore, the computer-readable storage mediums are readable by a machine, tangibly embodying a program of instructions executable by the machine to perform methods and processes described herein.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a read-only memory (ROM), an erasable programmable read-only memory (EPROM or Flash memory), a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object-oriented programming language such as Java™ Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language). The phrase "at least one of . . . and . . . ." as used herein refers to and encompasses any and all possible combinations of one or more of the associated listed items. As an example, the phrase "at least one of A, B, and C" includes A only, B only, C only, or any combination thereof (e.g. AB, AC, BC or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A semantics system for predicting effects of a stimulus on a particle, comprising:
   one or more processors;
   a memory communicably coupled to the one or more processors and storing:
   a segmentation module including instructions that when executed by the one or more processors cause the one or more processors to receive a segmented image of the particle that identifies at least semantics of the particle and associated characteristics according to subregions of the particle; and
   a prediction module including instructions that when executed by the one or more processors cause the one or more processors to analyze, using a stimulus model, the segmented image to predict changes in the particle associated with applying the stimulus to the particle,
   wherein the prediction module includes instructions to generate a predicted image of the particle according to the changes, and
   wherein the prediction module includes instructions to provide the predicted image as an electronic output.

2. The semantics system of claim 1, wherein the stimulus is a stress that effects a physical structure of the particle including the semantics and the associated characteristics,
   wherein the prediction module includes instructions to analyze the segmented image using the stimulus model to predict the changes without applying the stress to the particle, and
   wherein the prediction module includes instructions to generate the predicted image including instructions to generate the predicted image with segments identifying modified subregions according to the stimulus.

3. The semantics system of claim 1, wherein the stimulus model is a machine learning algorithm that accepts the segmented image as an electronic input and generates the predicted image to simulate effects of the stimulus on the particle.

4. The semantics system of claim 1, wherein the prediction module includes instructions to analyze the segmented image to predict the changes including instructions to predict modifications to the semantics through inferences embodied in the stimulus model about how at least the associated characteristics of the particle respond to the stimulus, and
   wherein the stimulus includes one of heat, mechanical stress, chemical exposure, and electrochemical effects, and wherein the stimulus model is trained to predict the changes for a single stress.

5. The semantics system of claim 1, wherein the segmentation module includes instructions to receive a particle image from a transmission electron microscopy (TEM) microscope that scans the particle to produce the particle image,
   wherein the particle image includes diffraction patterns that are patterns of electrons as scattered onto a detector in the TEM microscope resulting from the electrons interacting with the particle at a location corresponding with a respective pixel of pixels in the particle image.

6. The semantics system of claim 5, wherein the segmentation module includes instructions to analyze, using a semantics model that performs semantic segmentation, the particle image to produce the segmented image by identifying the associated characteristics of the particle associated with pixels of the particle image, and
   wherein the segmentation module includes instructions to identify the semantics of the particle from the segmented image according to relationships between the subregions that define the semantics for the particle.

7. The semantics system of claim 1, wherein the stimulus model is a generative adversarial network (GAN).

8. The semantics system of claim 1, wherein the prediction module includes instructions to train the stimulus model using pairs of segmented images for a plurality of particles depicting the particles before and after being subjected to the stimulus.

9. A non-transitory computer-readable medium for predicting effects of a stimulus on a particle and including instructions that when executed by one or more processors cause the one or more processors to:
   receive a segmented image of the particle that identifies at least semantics of the particle and associated characteristics according to subregions of the particle;
   analyze, using a stimulus model, the segmented image to predict changes in the particle associated with applying the stimulus to the particle, wherein the instructions to predict the changes include instructions to generate a predicted image of the particle according to the changes; and
   provide the predicted image as an electronic output.

10. The non-transitory computer-readable medium of claim 9, wherein the stimulus is a stress that effects a physical structure of the particle including the semantics and the associated characteristics,
    wherein the instructions include instructions to analyze the segmented image using the stimulus model to predict the changes without applying the stress to the particle, and
    wherein the instructions include instructions to generate the predicted image including instructions to generate the predicted image with segments identifying modified subregions according to the stimulus.

11. The non-transitory computer-readable medium of claim 9, wherein the stimulus model is a machine learning algorithm that accepts the segmented image as an electronic input and generates the predicted image to simulate effects of the stimulus on the particle.

12. The non-transitory computer-readable medium of claim 9, wherein the instructions to analyze the segmented image to predict the changes including instructions to predict modifications to the semantics through inferences embodied in the stimulus model about how at least the associated characteristics of the particle respond to the stimulus, and
    wherein the stimulus includes one of heat, mechanical stress, chemical exposure, and electrochemical effects, and wherein the stimulus model is trained to predict the changes for a single stress.

13. The non-transitory computer-readable medium of claim 9, wherein the instructions include instructions to receive a particle image from a transmission electron microscopy (TEM) microscope that scans the particle to produce the particle image, wherein the particle image includes diffraction patterns that are patterns of electrons as scattered onto a detector in the TEM microscope resulting from the electrons interacting with the particle at a location corresponding with a respective pixel of pixels in the particle image.

14. A method of predicting effects of a stimulus on a particle, comprising:

receiving a segmented image of a particle that identifies at least semantics of the particle and associated characteristics according to subregions of the particle;

analyzing, using a stimulus model, the segmented image to predict changes in the particle associated with applying the stimulus to the particle, wherein analyzing the segmented image includes generating a predicted image of the particle according to the changes; and providing the predicted image as an electronic output.

15. The method of claim 14, wherein the stimulus is a stress that effects a physical structure of the particle including the semantics and the associated characteristics, wherein analyzing the segmented image using the stimulus model predicts the changes without applying the stress to the particle, and wherein generating the predicted image includes generating the predicted image with segments identifying modified subregions according to the stimulus.

16. The method of claim 14, wherein the stimulus model is a machine learning algorithm that accepts the segmented image as an electronic input and generates the predicted image to simulate effects of the stimulus on the particle.

17. The method of claim 14, wherein analyzing the segmented image to predict the changes includes predicting modifications to the semantics through inferences embodied in the stimulus model about how at least the associated characteristics of the particle respond to the stimulus, and wherein the stimulus includes one of heat, mechanical stress, chemical exposure, and electrochemical effects, and wherein the stimulus model is trained to predict the changes for a single stress.

18. The method of claim 14, further comprising:

receiving a particle image from a transmission electron microscope (TEM) that scans the particle to produce the particle image, wherein the particle image includes diffraction patterns that are patterns of electrons as scattered onto a detector in the TEM resulting from the electrons interacting with the particle at a location corresponding with a respective pixel of pixels in the particle image.

19. The method of claim 18, further comprising:

analyzing, using a model that performs semantic segmentation, the particle image to produce the segmented image by identifying the associated characteristics of the particle associated with pixels of the particle image, and identifying the semantics of the particle from the segmented image according to relationships between the subregions that define the semantics for the particle.

20. The method of claim 14, further comprising:

training the stimulus model using pairs of segmented images for a plurality of particles depicting the particles in pre-stimulus states and post-stimulus states, wherein the stimulus model is a generative adversarial network (GAN).

* * * * *